United States Patent
Schemm

(10) Patent No.: US 10,644,702 B2
(45) Date of Patent: May 5, 2020

(54) LEVEL SHIFTER AND METHOD OF CALIBRATION

(71) Applicant: Texas Instruments Incorporated, Dallas, TX (US)

(72) Inventor: Nathan Richard Schemm, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/108,246

(22) Filed: Aug. 22, 2018

(65) Prior Publication Data

US 2018/0358968 A1 Dec. 13, 2018

Related U.S. Application Data

(63) Continuation of application No. 15/463,404, filed on Mar. 20, 2017, now Pat. No. 10,097,183.

(60) Provisional application No. 62/315,471, filed on Mar. 30, 2016.

(51) Int. Cl.
*H03K 19/0185* (2006.01)

(52) U.S. Cl.
CPC .......................... *H03K 19/018507* (2013.01)

(58) Field of Classification Search
None
See application file for complete search history.

(56) References Cited

U.S. PATENT DOCUMENTS

| | | | | |
|---|---|---|---|---|
| 6,897,492 | B2* | 5/2005 | Ochi | H01L 23/5228 257/107 |
| 6,919,743 | B2* | 7/2005 | Tobita | G09G 3/3688 326/62 |
| 7,489,209 | B2* | 2/2009 | Mosesov | H03B 5/06 331/116 FE |
| 8,134,399 | B2* | 3/2012 | Chen | H03K 19/01852 326/80 |
| 9,847,753 | B2* | 12/2017 | Ho | H03B 5/364 |
| 2004/0041614 | A1* | 3/2004 | Tobita | H03K 3/356113 327/333 |
| 2008/0315938 | A1* | 12/2008 | Ishikawa | H03K 17/567 327/333 |
| 2009/0146719 | A1* | 6/2009 | Pernia | H03B 5/04 327/291 |
| 2009/0243702 | A1* | 10/2009 | Kossel | H03J 3/185 327/427 |
| 2013/0106485 | A1* | 5/2013 | Mukhopadhyay | H03K 19/01850 327/333 |
| 2015/0280695 | A1* | 10/2015 | Li | H03K 3/35613 327/109 |

* cited by examiner

*Primary Examiner* — Lincoln D Donovan
*Assistant Examiner* — Khareem E Almo
(74) *Attorney, Agent, or Firm* — Mark Allen Valetti; Charles A. Brill; Frank D. Cimino

(57) ABSTRACT

A level shifter includes a signal generator that generates differential signals on a first output and a second output. A first capacitor is coupled between the first output and a first node and a second capacitor is coupled between the second output and a second node. A third capacitor is coupled between the first node and a first voltage potential, wherein the capacitance of the third capacitor is variable. A fourth capacitor is coupled between the second node and the first voltage potential, wherein the capacitance of the fourth capacitor is variable.

20 Claims, 4 Drawing Sheets

US 10,644,702 B2

LEVEL SHIFTER AND METHOD OF CALIBRATION

CROSS-REFERENCE TO RELATED APPLICATION

Under 35 U.S.C. § 120, this continuation application claims benefits of and priority to U.S. patent application Ser. No. 15/463,404 (TI-76889), filed on Mar. 20, 2017, which under 35 U.S.C. § 119(e), claims priority to U.S. Provisional Patent Application Ser. No. 62/315,471, filed Mar. 30, 2016. The entirety of the above referenced applications is hereby incorporated herein by reference for all purposes.

BACKGROUND

Voltage translators or level shifters are devices that resolve mixed voltage incompatibility between different parts of a system that operate in multiple voltage domains. They are common in many complex electronic systems, especially when interfacing with legacy devices. With the advent of wide-bandgap semiconductors, the switching speeds of level shifters are increasing. However, present level shifters do not have the required high common-mode transient immunity (CMTI) with propagation times that are fast enough to handle these high switching speeds.

SUMMARY

A level shifter includes a signal generator that generates differential signals on a first output and a second output. A first capacitor is coupled between the first output and a first node and a second capacitor is coupled between the second output and a second node. A third capacitor is coupled between the first node and a first voltage potential, wherein the capacitance of the third capacitor is variable. A fourth capacitor is coupled between the second node and the first voltage potential, wherein the capacitance of the fourth capacitor is variable.

DETAILED DESCRIPTION

Level shifters with high common-mode transient immunity (CMTI) and low propagation delay are disclosed herein. The high CMTI enables the level shifters to operate at high switching frequencies in applications such as driving high voltage field-effect transistors (FETs). In some examples, the level shifters drive high-side signal translations for FET drivers of wide-bandgap power FETs in high voltage switching power supplies. Such wide-bandgap FETs can include gallium nitride and silicon carbide (GaN and SiC) power FETs. With the emergence of such wide-bandgap semiconductors, switching speeds of switching power supplies are increasing, which is creating greater demands on the gate drivers and level shifters within the switching power supplies. Traditional switching power supplies reduce switching losses by implementing wide-bandgap drivers having slew-rates that are higher than current level shifters can support without errors.

Figure 1:
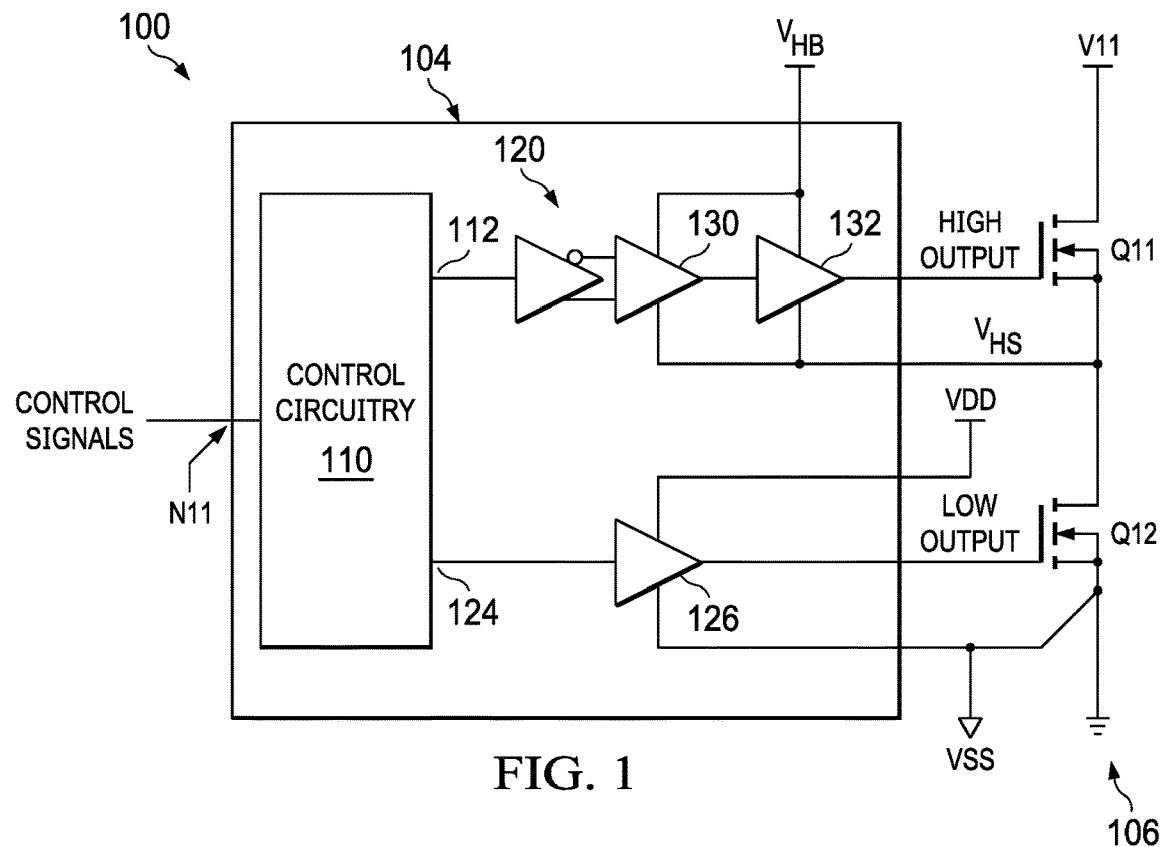
FIG. 1 is a schematic diagram of a portion of a switching power supply.

FIG. 1 is a schematic diagram of a portion of a switching power supply 100. The power supply 100 includes a controller 104 that is coupled to a switching portion 106, whereby the controller 104 drives a FET Q11 and a FET Q12 in the switching portion 106. The FET Q11 is sometimes referred to as a high-side FET and the FET Q12 is sometimes referred to as a low-side FET. In some examples, the FETs Q11 and Q12 are wide-bandgap GaN FETs with drain/source breakdown voltages of approximately 600V. The FETs Q11 and Q12 are examples of switches that may be implemented in the switching portion 106. Other switching devices may be implemented in the power supply 100 as known by those skilled in the art. The power supply 100 enables a high voltage swing between a transmitter (not shown) and a receiver (not shown).

The drain of FET Q11 is coupled to a voltage source V11, which is a high voltage source and in some examples the voltage source V11 has a voltage potential between zero and 600V. The source of FET Q12 is coupled to a voltage potential, which in the example of FIG. 1, is a ground.

The controller 104 includes control circuitry 110 that may receive and output a plurality of signals and voltages to drive the switching portion 106. In the example controller 104, the control circuitry 110 receives a control signal at a node N11. In some examples, the controls signals include a pulse width modulated (PWM) signal, which controls or sets the timing of the switching portion 106. In other examples, the control circuitry 110 may have other inputs coupled thereto. The control circuitry 110 has an output 112 coupled to the input of a level shifter 120 and an output 124 coupled to the input of a driver 126 that drives the FET Q12.

The level shifter 120 enables the controller 104 to operate the FET Q11 at a high voltage when the controller 104 itself is operated at a much lower voltage. The level shifter 120 has an output 130 that is coupled to a driver or amplifier 132, which controls the gate voltage of the FET Q11. Likewise, the driver 126 controls the gate voltage of the FET Q12. The driver 126 operates at a voltage VDD, such as 5V, relative to a voltage VSS, which may be ground. The level shifter 120 and the driver 132 may operate at a small voltage, but their ground reference $V_{HS}$ may be much higher than the VSS potential. Accordingly, the voltage difference between the ground reference $V_{HS}$ and a supply voltage $V_{HB}$ may be VDD or 5V.

When the FET Q12 turns off, the FET Q11 turns on and the voltage $V_{HS}$ rapidly slews up to the voltage V11. The output of the level shifter 120 also slews up with the voltage $V_{HS}$, which produces a very fast common-mode transient for the level shifter 120. High speed switching power supplies require a driver with very good common-mode transient immunity (CMTI) to withstand the high slew rates of wide-bandgap devices such as the FETs Q11 and Q12. Many switching power supplies further require low propagation time and propagation matching to support high switching frequencies. Furthermore, many switching power supplies require level shifters with low quiescent current consumption. Level shifters are disclosed herein that have high CMTI, operate at high switching frequencies, and draw low quiescent current.

Figure 2:
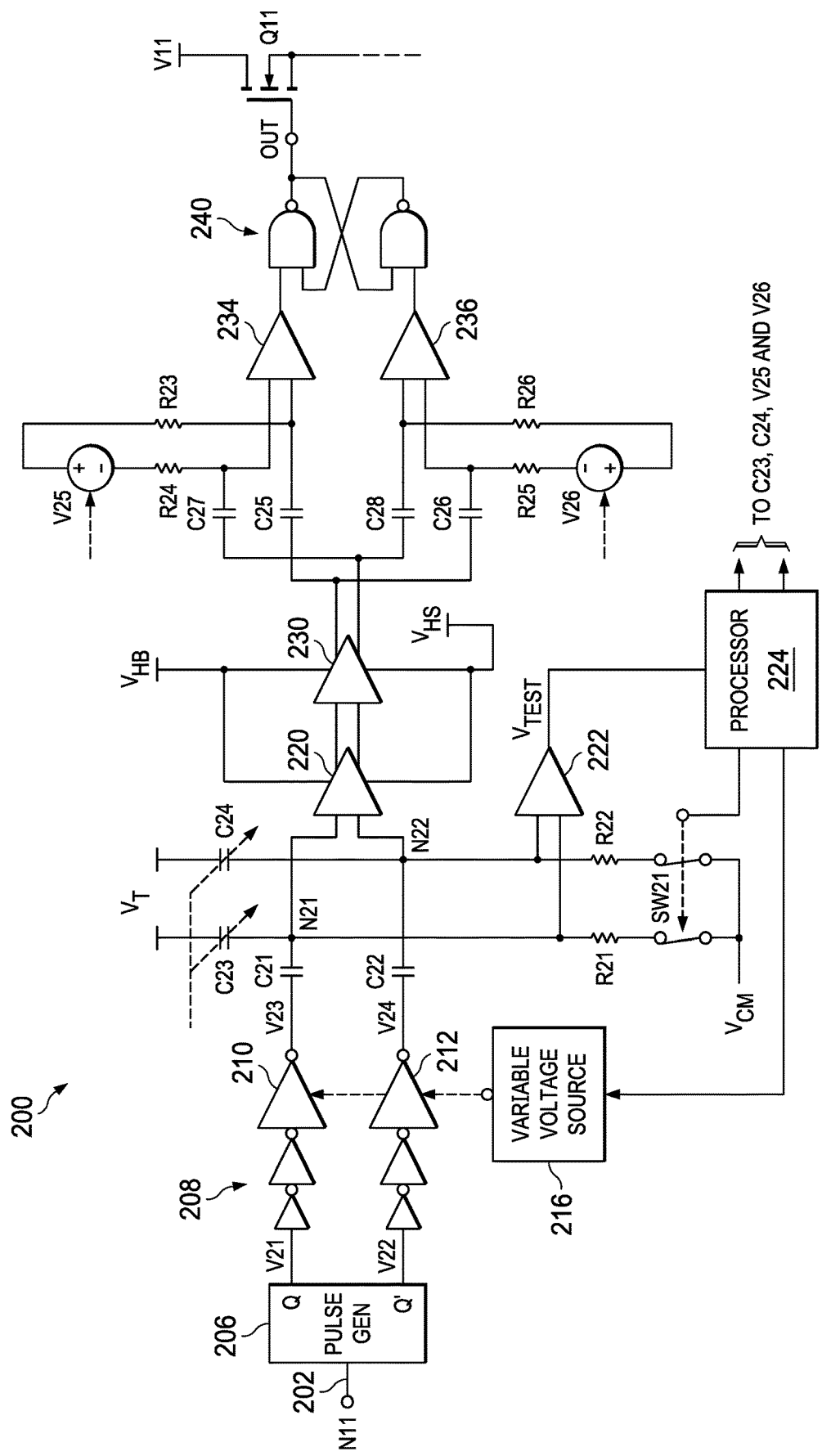
FIG. 2 is a schematic diagram of an example of a level shifter of the power supply of FIG. 1 that is tunable so as to increase common mode transient immunity.

FIG. 2 is a schematic diagram of an example of a level shifter 200 that is tunable to increase CMTI. The level shifter 200 is coupled to an input that may be coupled to the node N11 of FIG. 1. The input 202 is coupled to a pulse generator 206 that converts the input signal at the input 202 to a plurality of differential pulses that are output on nodes Q and Q'. The signal output on the node Q is referred to as the signal V21 and the signal output on the node Q' is referred to as V22. In other examples, signal generation devices other than the pulse generator 206 may be implemented to generate differential signals representative of the input signal on node N11.

The nodes Q and Q' are coupled to a plurality of drivers 208. The last of the drivers 208 are a driver 210 and a driver 212 that are coupled to or powered by a variable voltage source 216. The variable voltage source 216 sets the amplitude of the signals V23 and V24 at the output of the drivers 210 and 212. As described in greater detail below, the variable voltage source 216 varies the amplitudes of the signals V23 and V24 to calibrate the output amplitude of the level shifter 200. In some examples, the plurality of drivers 208 are implemented with a single driver coupled to the Q node and a single driver coupled to the Q' node.

A capacitor C21 is coupled between the driver 210 and a node N21 and a capacitor C22 is coupled between the driver 212 and a node N22. The capacitors C21 and C22 isolate the voltage potential $V_{HS}$ from low voltage circuitry, such as the drivers 208 and the pulse generator 206. A capacitor C23 is coupled between the node N21 and a voltage termination $V_T$. A capacitor C24 is coupled between the node N22 and the voltage termination $V_T$. The voltage termination $V_T$ may be a plurality of different voltages as described herein. The capacitors C23 and C24 are variable or able to be trimmed to improve the CMTI at nodes N21 and N22 as described in greater detail below. In some examples, the capacitance values of the capacitors C23 and C24 are greater than the capacitance values of the capacitors C21 and C22. The capacitors C21 and C23 form a voltage divider at node N21 and capacitors C22 and C24 form a voltage divider at node N22. The signals V23 and V24 are typically high frequency signals or contain high frequency components, such as step functions, which are able to pass through capacitors C21 and C22 and become a differential signal at nodes N21 and N22. Common-mode signals are generated on N21 and N22 in response to CMTI across the level shifter 200. During calibration, the ratio of C21 to C23 is closely matched to the ratio of C22 to C24 to minimize the differential output produced on nodes N21 and N22 in response to CMTI. If the ratios are not closely matched, transient common mode voltages may cause delays and/or errors in processing of the signals V23 and V24 as described herein.

Differential inputs of a differential amplifier 220 are coupled to the nodes N21 and N22. The differential amplifier 220 processes the signals V21 and V22 as described herein. Differential inputs of another differential amplifier 222 are also coupled to the nodes N21 and N22. The differential amplifier 222 measures the differential transient response on the nodes N21 and N22 during a transient test and generates a signal $V_{TEST}$, which is proportional to the differential transient response. The signal $V_{TEST}$ is input to a processor 224 that trims the capacitance values of the capacitors C23 and C24 in response to the signal $V_{TEST}$.

A resistor R21 couples a voltage source $V_{CM}$ to the node N21 by way of a switch SW21 and a resistor R22 couples the voltage source $V_{CM}$ to the node N22 by way of the switch SW21. The state of the switch SW21 is set by the processor 224 and the switch SW21 serves to charge the nodes N21 and N22 to the voltage $V_{CM}$, which is the common mode voltage of the differential amplifier 220. The charges on the nodes N21 and N22 are analyzed by the processor 224 to determine the proper capacitance values of the capacitors C23 and C24 to maximize CMTI as described herein.

In the example of FIG. 2, the output of the differential amplifier 220 is coupled to the input of a second differential amplifier 230. In the example of FIG. 2, the differential amplifier 220 has a very good high-frequency common mode rejection ratio (CMRR). For example, a two volt swing over a two nanosecond period may produce a maximum 2 mV differential swing on the output of the differential amplifier 220. The CMRR of the differential amplifier 220 is a factor that limits the CMTI of the level shifter 200. The differential amplifier 220 is sometimes referred to herein as the first stage. Common-mode voltage swings on the nodes N21 and N22 have little effect on the gain of the differential amplifier 220. The differential amplifier 230 has moderate gain, which may be less than the gain of the differential amplifier 220. Furthermore, the differential amplifier 230 has low output impedance to drive large loads of components coupled to the outputs of the differential amplifier 230 as described herein.

The differential output of the differential amplifier 230 is coupled to a first RC network, which in turn is coupled to the inputs of a comparator 234. The differential output of the differential amplifier 230 is also coupled to a second RC network, which in turn is coupled to the inputs of a comparator 236. A high output of the differential amplifier 230 is coupled to capacitors C25 and C26 and a low output of the differential amplifier 230 is coupled to capacitors C27 and C28. The capacitors C25 and C27 are coupled to inputs of the comparator 234 and capacitors C26 and C28 are coupled to inputs of the comparator 236. Resistors R23 and R24 couple the inputs of the comparator 234 to a voltage source V25 and resistors R25 and R26 coupled the inputs of the comparator 236 to a voltage source V26. The voltage source V25 sets a threshold for triggering voltage transitions on the output of the comparator 234 and the voltage source V26 sets a threshold for triggering voltage transitions on the output of the comparator 236. The outputs of the comparators 234 and 236 are coupled to the input of a latch 240 that, in the example of FIG. 2, includes two NAND gates. The output of the latch 240 is coupled to the gate of transistor Q11. In some examples, an amplifier or driver (not shown) is coupled between the latch 240 and the gate of transistor Q11.

Figure 3:
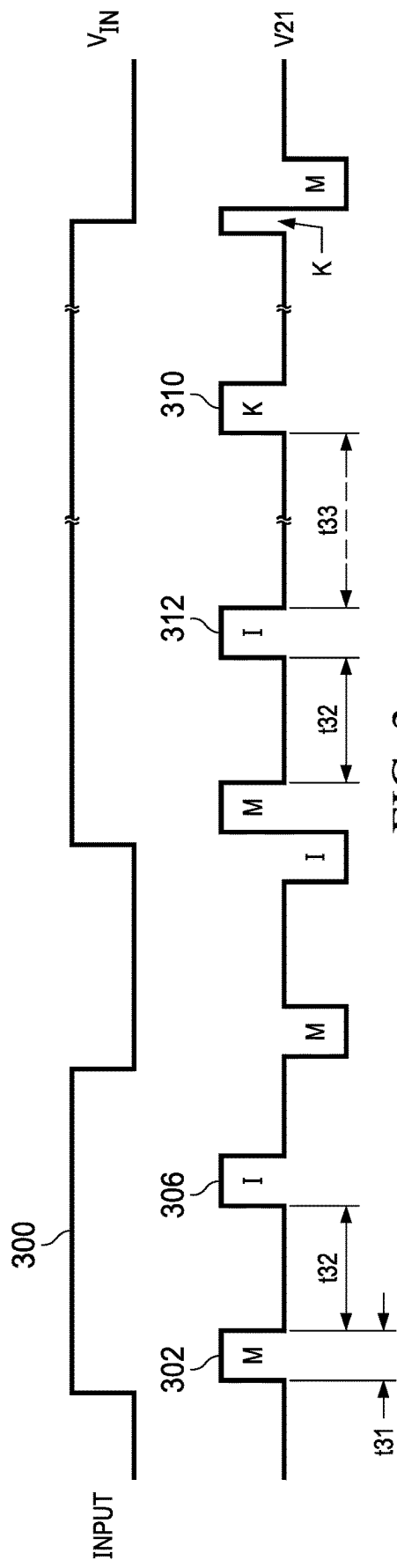
FIG. 3 is an example of a signal generated by the pulse generator of FIG. 2 in response to an input voltage.

FIG. 3 is an example of the signal V21, FIG. 2, generated by the pulse generator 206 in response to the signal received on node N11. The signal V22 is the complement of the signal V21. The signal V21 shown in FIG. 3 is an example of a plurality of different signal types that may be generated by the pulse generator 206. In the example of FIG. 3, the pulse generator 206 generates either positive or negative pulses on the rising and falling edges of the input signal at node N11. The pulse generator 206 further generates pulses to keep the level shifter 200 active. The input signal has a rising edge 300, which causes the pulse generator 206 to generate a pulse 302 that has a predetermined pulse width t31. In the example of FIG. 3, the predetermined pulse width t31 is 3 ns. The pulse 302 is referenced by the letter M to denote that it is a main pulse generated at the beginning of a transition in the input signal. Insurance pulses, referenced as the letter I, are transmitted after a predetermined time t32 from the main pulses. In the example of FIG. 3, an insurance pulse 306 is shown being transmitted after a predetermined time t32 from the main pulse 302. In the example of FIG. 3, the predetermined time t32 between the main pulse and the insurance pulse is 20 ns. If the input signal has not transitioned after a predetermined time t33, the pulse generator 206 generates a keep pulse, referenced by the letter K. In the example of FIG. 3, the pulse generator 206 has generated a keep pulse 310 at a time t33 from the generation of the insurance pulse 312.

The pulses in the signals V23 and V24 conduct through the capacitors C21 and C22, respectively, and are terminated at the capacitors C23 and C24, which may have capacitance values substantially larger than the capacitance values of the capacitors C21 and C22. The differences in capacitance values form capacitive voltage dividers between the outputs of the drivers 210, 212 and the nodes N21, N22. In the examples described herein, the voltage dividers have a large ratio, such as 330V/V. The ratio is chosen such that the full voltage swing of the input relative to the output is equal to at least half of the overall common-mode range of the differential amplifier 220.

As described above, the capacitors C23 and C24 are trimmable in order to trim out the common-mode to differential conversion which would otherwise occur due to mismatched ratios in the capacitance values of C21/C23 and C22/C24 as described herein. Trimming the capacitors C23 and C24 may be performed after assembly of the level shifter 200, such as during testing. The input signal on node N11 is inactive during testing, so the pulse generator 206 does not generate any pulses. The processor 224 closes switch SW21, which charges the capacitors C21, C22, C23, and C24 by way of the common mode voltage $V_{CM}$. A high impedance situation is then created by the processor 224 opening switch SW21, which allows any differential errors on the nodes N21 and N22 to be held there for readout through the amplifier 222. The $V_{HS}$ voltage is then swept to a high voltage relative to the input of the level shifter. Then, any differential errors related to capacitor mismatch are held on the capacitors C21, C22, C23, and C24 and read by the processor 224 via the differential amplifier 222. If the ratio of the capacitance values of the capacitors C21 to C23 is equal to the ratio of the capacitance values of the capacitors C22 to C24, then the voltage on node N21 will be equal to the voltage on node N22. The amplifier 222 measures the difference between the voltages on nodes N21 and N22 and outputs the difference to the processor 224. In the example described herein, the amplifier 222 has a gain of twenty, but other gain values may be implemented as required by specific applications. The processor 224 then determines the values of the capacitors C23 and C24. It is noted that in some examples, the processor 224 is separate from the level shifter 220.

As described above, mismatch in the ratios of the capacitances of the capacitors C21, C22, C23, and C24 creates a common-mode to differential conversion and trimming the capacitors C23 and C24 improves the common-mode to differential conversion performance. The trimming process is converted into a low frequency trim by disconnecting the common voltage source $V_{CM}$ from resistors R21 and R22, which sets DC voltages on the capacitors C23 and C24. The DC voltages on the capacitors C23 and C24 are the voltage on the nodes N21 and N22, respectively. Then, the common-mode is swept and any errors created by the mismatch are left on the capacitors C23 and C24 and are measured via the amplifier 222. Sweeping the common mode includes moving the high-voltage side of the level shifter 200 from 0V where it was when the switch SW21 was open to a high voltage. The high voltage develops across the C21 and C22. The measuring may be accomplished over a long period due to a slow time constant associated with the capacitors C23 and C24. The amplifier 222 can be double-sampled to eliminate any offset error in the amplifier itself. For example, the output of the amplifier 222 may be sampled before SW21 is opened and both inputs are still at the same voltage potential, and then sampled again after the error on N21 and N22 have settled. The difference of the two readings gives an error which is independent of the offset of the amplifier 222.

As described above, the output signal or voltage of the amplifier 222 is received by the processor 224. The processor 224 then analyzes the voltage output by the amplifier 222 to determine which of the capacitors C23 and/or C24 needs to be trimmed and how much trimming needs to occur so the above-described ratios are equal. The process of measuring the common-mode to differential conversion may be repeated after an initial trimming to be sure that the capacitors C23 and C24 have been trimmed correctly.

Figure 4:
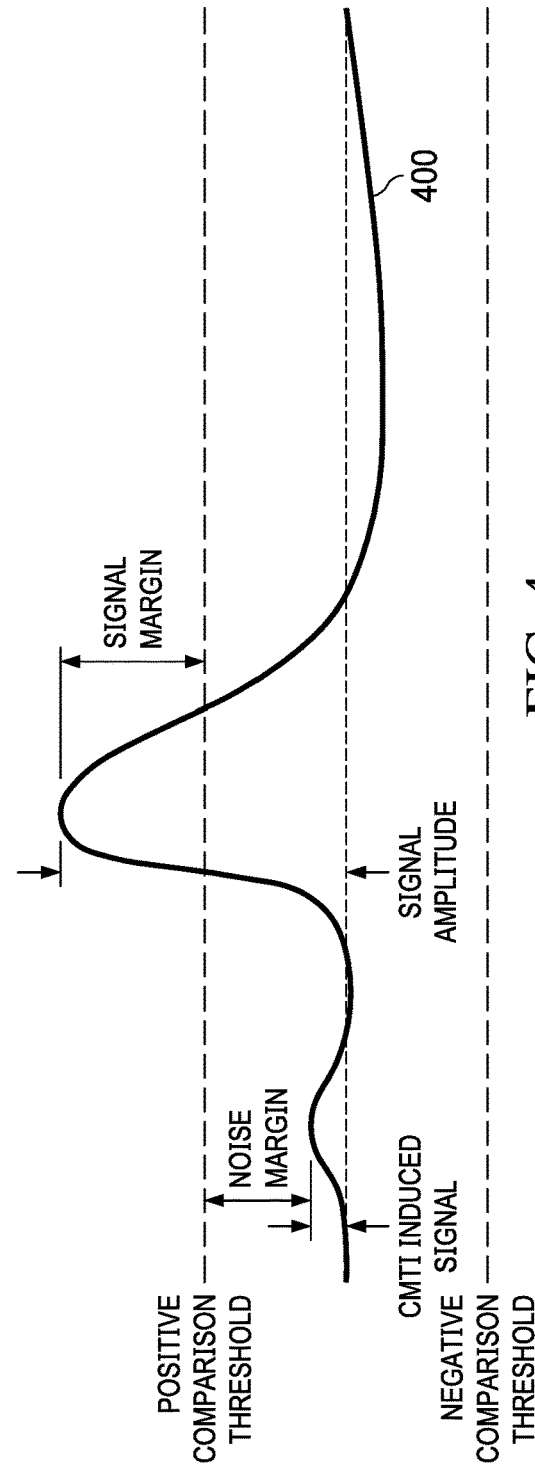
FIG. 4 is an example of a signal at the output of an amplifier of FIG. 2 in response to a pulse generated by the pulse generator of FIG. 2.

FIG. 4 is a graph showing an example signal 400 at the output of the amplifier 230 in response to a pulse generated by the pulse generator 206, FIG. 2. The graph shows a noise margin between a positive comparison threshold and a negative comparison threshold where the signal 400 is not detectable. As shown in FIG. 4, a CMTI induced signal is present in the signal 400, but it is within the noise margin and will not induce errors. The signal 400 exceeds the positive comparison threshold and enters a signal margin at a time 402. The signal amplitude of the signal 400 determines how far in excess of the noise margin the signal 400 extends. If the signal amplitude is too low, the signal 400 will not be detected above the noise margin.

The level shifter 200 provides the ability to set the threshold level of the comparators 234 and 236 to achieve a signal, such as the signal 400 of FIG. 4 with appropriate signal and noise margins. In the examples described herein, the signal amplitude is set to twice that of the noise margin. The process includes adjusting the output of the drivers 210 and 212 to lower voltages. In the example of FIG. 2, the output voltages of the drivers are set to half of their normal operating voltage by way of the variable voltage source 216 supplying a lower or half voltage to the drivers 210 and 212. The voltages V25 and V26 are then adjusted to where the signal 400 just exceeds the noise margin. The output of the comparators 234, 236 or the output of the latch 240 may be monitored to determine if the signal 400 has exceeded the noise margin. The processor 224 then instructs the variable voltage source 216 to output the full voltage to the drivers 210 and 212, which returns the output of the drivers 210 and 212 to their full voltages. The signal amplitude 400 is then as shown in FIG. 4.

Figure 5:
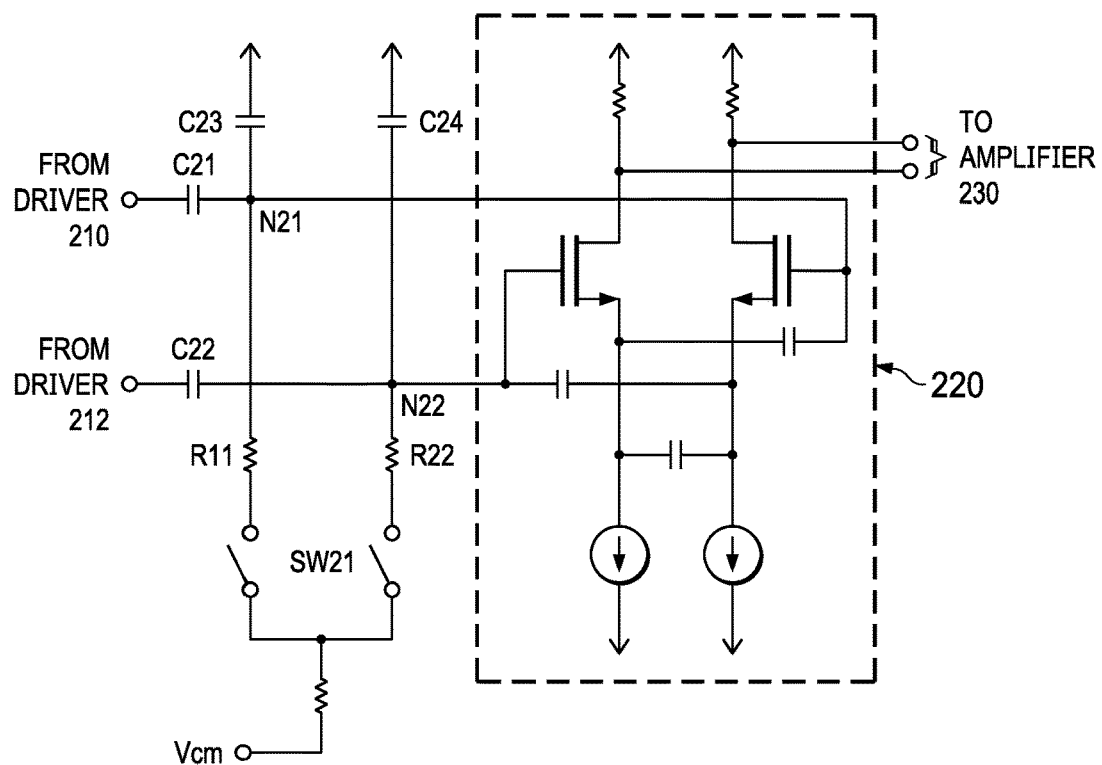
FIG. 5 is a detailed schematic diagram of an example of the first differential amplifier of FIG. 2.

FIG. 5 is a schematic diagram of an example of the differential amplifier 220 of FIG. 2. The first stage of the amplifier 220 provides benefits that improve the operation of the level shifter 200, FIG. 2. The capacitors C23 and C24 may be terminated with a voltage VDD, ground, or a voltage in between ground and VDD. The amplifier 220 has a very high common-mode rejection ratio (CMRR), which is achieved by taking advantage of the inputs and nodes N21 and N22, which can be loaded with high capacitance without affecting the circuit amplifier 220.

Figure 6:
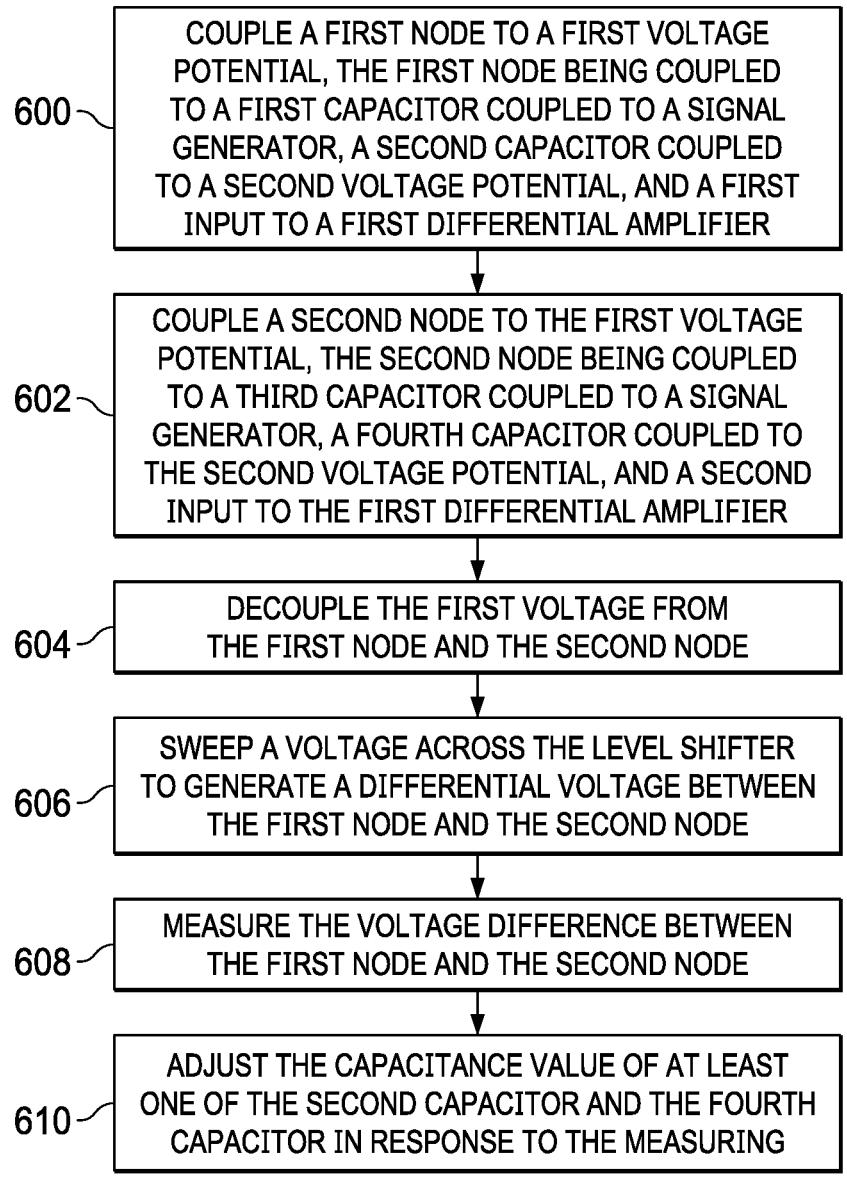
FIG. 6 is a flow diagram describing a method of calibrating a level shifter, such as the level shifter of FIG. 2

FIG. 6 is a flow diagram describing a method of calibrating a level shifter, such as the level shifter 200 of FIG. 2. The method commences at step 600 with coupling a first node to a first voltage potential. The first node is coupled to a first capacitor that is coupled to a signal generator, a second capacitor coupled to a second voltage potential, and a first input to a first differential amplifier. Step 602 includes coupling a second node to the first voltage potential. The second node is coupled to a third capacitor that is coupled to the signal generator, a fourth capacitor coupled to the second voltage potential, and a second input to the first differential amplifier. Step 604 includes decoupling the first voltage from the first node and the second node. Step 606 includes sweeping a voltage across the level shifter to generate a differential voltage between the first node and the second node. Step 608 includes measuring the voltage difference between the first node and the second node. Step 610 includes adjusting the capacitance value of at least one of the second capacitor and the fourth capacitor in response to the measuring.

Although illustrative embodiments have been shown and described by way of example, a wide range of alternative embodiments is possible within the scope of the foregoing disclosure.

What is claimed is:

1. A circuit comprising:
a first input terminal adapted to receive a first capacitor having a first capacitance;
a second input terminal adapted to receive a second capacitor having a second capacitance;
a terminal voltage source;
a third capacitor coupled between the first input terminal and the terminal voltage source, and having a third capacitance defining a first ratio over the first capacitance; and
a fourth capacitor coupled between the second input terminal and the terminal voltage source, and having a fourth capacitance defining a second ratio over the second capacitance, the second ratio matching the first ratio.

2. The circuit of claim 1, further comprising:
a common mode voltage source;
a first switch coupled between the first input terminal and the common mode voltage source; and
a second switch coupled between the second input terminal and the common mode voltage source.

3. The circuit of claim 1, further comprising:
a differential amplifier having a first input coupled to the first input terminal, and a second input coupled to the second input terminal, the differential amplifier configured to generate a test signal based on a voltage difference between the first and second input terminals when the first and second input terminals are decoupled from a common mode voltage source.

4. The circuit of claim 3, wherein:
the third capacitor includes a first adjustable capacitor;
the fourth capacitor includes a second adjustable capacitor; and
at least one of the third capacitance or the fourth capacitance is adjusted based on the test signal such that the second ratio approximates the first ratio.

5. The circuit of claim 4, further comprising:
a processor coupled to receive the test signal from the differential amplifier, and configured to provide instructions to adjust at least one of the third capacitance or the fourth capacitance.

6. The circuit of claim 5, wherein the processor is configured to decouple the common mode voltage source from the first and second input terminals while the test signal is being generated.

7. The circuit of claim 5, wherein the processor is configured to determine a common mode transient immunity between the first input terminal and the second first input terminal based on the test signal.

8. The circuit of claim 1, wherein the first capacitance is different from the second capacitance.

9. A level shifter comprising:
first and second input terminals;
a terminal voltage source;
a supply voltage source;
a first adjustable capacitor coupled between the first input terminal and the terminal voltage source;
a second adjustable capacitor coupled between the second input terminal and the terminal voltage source; and
a differential amplifier having a supply terminal coupled to the supply voltage source, a first differential input coupled to the first input terminal, a second differential input coupled to the second input terminal, and a differential output.

10. The level shifter of claim 9, further comprising:
a common mode voltage source;
a first switch coupled between the first input terminal and the common mode voltage source; and
a second switch coupled between the second input terminal and the common mode voltage source.

11. The level shifter of claim 9, further comprising:
a second differential amplifier having a first input coupled to the first input terminal, and a second input coupled to the second input terminal, the second differential amplifier configured to generate a test signal based on a voltage difference between the first and second input terminals when the first and second input terminals are decoupled from a common mode voltage source,
wherein the differential amplifier is a first differential amplifier.

12. The level shifter of claim 11, further comprising:
a processor coupled to receive the test signal from the second differential amplifier, and configured to determine a common mode transient immunity between the first input terminal and the second first input terminal based on the test signal.

13. The level shifter of claim 12, wherein the processor is configured to decouple the common mode voltage source from the first and second input terminals while the test signal is being generated.

14. The level shifter of claim 12, wherein the processor is configured to adjust at least one of the first adjustable capacitor or the second adjustable capacitor based on the common mode transient immunity.

15. The level shifter of claim 12, wherein:
the first input terminal is adapted to receive a third capacitor having a third capacitance;
the second input terminal adapted to receive a fourth capacitor having a fourth capacitance;
the first adjustable capacitor having a first capacitance;
the second adjustable capacitor having a second capacitance; and
the processor is configured to adjust at least one of the first capacitance or the second capacitance such that a first ratio of the first capacitance over the third capacitance approximates a second ratio of the second capacitance over the fourth capacitance.

16. A level shifter comprising:
first and second input terminals;
a terminal voltage source;
a first adjustable capacitor coupled between the first input terminal and the terminal voltage source;

a second adjustable capacitor coupled between the second input terminal and the terminal voltage source;

a common mode voltage source;

a first switch coupled between the first input terminal and the common mode voltage source;

a second switch coupled between the second input terminal and the common mode voltage source;

a differential amplifier having a first input coupled to the first input terminal, a second input coupled to the second input terminal, and an amplifier output; and a processor coupled to the amplifier output of the differential amplifier, and configured to determine a common mode transient immunity between the first input terminal and the second first input terminal based on the amplifier output.

17. The level shifter of claim 16, wherein:

the differential amplifier is configured to generate a test signal based on a voltage difference between the first and second input terminals when the first and second input terminals are decoupled from the common mode voltage source.

18. The level shifter of claim 17, wherein:

the processor is configured to determine the common mode transient immunity between the first input terminal and the second first input terminal based on the test signal.

19. The level shifter of claim 18, wherein the processor is configured to adjust at least one of the first adjustable capacitor or the second adjustable capacitor based on the common mode transient immunity.

20. The level shifter of claim 18, wherein:

the first input terminal is adapted to receive a third capacitor having a third capacitance;

the second input terminal adapted to receive a fourth capacitor having a fourth capacitance;

the first adjustable capacitor having a first capacitance;

the second adjustable capacitor having a second capacitance; and the processor is configured to adjust at least one of the first capacitance or the second capacitance such that a first ratio of the first capacitance over the third capacitance approximates a second ratio of the second capacitance over the fourth capacitance.

* * * * *